US012588410B2

(12) United States Patent
Xiong

(10) Patent No.: US 12,588,410 B2
(45) Date of Patent: Mar. 24, 2026

(54) ORGANIC ELECTROLUMINESCENT MATERIAL AND METHOD PREPARING THE SAME

(71) Applicants: Wuhan China Star Optoelectronics Technology Co., Ltd., Wuhan (CN); Wuhan China Star Optoelectronics Semiconductor Display Technology Co., Ltd., Wuhan (CN)

(72) Inventor: You Xiong, Wuhan (CN)

(73) Assignees: Wuhan China Star Optoelectronics Technology Co., Ltd., Wuhan (CN); Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 597 days.

(21) Appl. No.: 17/426,268

(22) PCT Filed: Jul. 20, 2021

(86) PCT No.: PCT/CN2021/107321

§ 371 (c)(1),
(2) Date: Dec. 22, 2022

(87) PCT Pub. No.: WO2022/262057

PCT Pub. Date: Dec. 22, 2022

(65) Prior Publication Data

US 2024/0016059 A1 Jan. 11, 2024

(30) Foreign Application Priority Data

Jun. 16, 2021 (CN) ......................... 202110665211.7

(51) Int. Cl.

| | |
|---|---|
| ***H10K 85/60*** | (2023.01) |
| ***C07F 5/02*** | (2006.01) |
| ***C09K 11/06*** | (2006.01) |
| ***H10K 50/12*** | (2023.01) |

(52) U.S. Cl.

CPC ........... *H10K 85/658* (2023.02); *C07F 5/027* (2013.01); *C09K 11/06* (2013.01); *C09K 2211/1018* (2013.01); *H10K 50/12* (2023.02)

(58) Field of Classification Search

None

See application file for complete search history.

(56) References Cited

FOREIGN PATENT DOCUMENTS

| | | |
|---|---|---|
| CN | 102482573 | 5/2012 |
| CN | 109134520 | 1/2019 |
| CN | 110563633 | 12/2019 |
| CN | 110759937 | 2/2020 |
| CN | 111100152 | 5/2020 |
| CN | 111116620 | 5/2020 |
| CN | 112552142 | 3/2021 |
| GB | 2589876 | 6/2021 |
| WO | WO 2018/099520 | 6/2018 |

OTHER PUBLICATIONS

Wei. CN 110698504, published Jan. 1, 20207, machine translation thereof (Year: 2020).*

McMurry. Organic Chemistry Fifth Edition, 2000, pages v and 605-618) (Year: 2000).*

* cited by examiner

*Primary Examiner* — Noble E Jarrell

(57) ABSTRACT

An organic electroluminescent material and a method preparing the same are disclosed. Material of the organic electroluminescent includes diboranthracene fluoride which has $R_1$ group and $R_2$ group. Material of the organic electroluminescent has a low single-triplet energy gap. Moreover, the preparation method and synthesis pathway are simple, with stable performance, thereby effectively reducing preparation costs of the organic electroluminescent material in display panels, and improving the luminescence performance of the panels.

15 Claims, 1 Drawing Sheet

ORGANIC ELECTROLUMINESCENT MATERIAL AND METHOD PREPARING THE SAME

RELATED APPLICATIONS

This application is a National Phase of PCT Patent Application No. PCT/CN2021/107321 having International filing date of Jul. 20, 2021, which claims the benefit of priority of Chinese Patent Application No. 202110665211.7 filed on Jun. 16, 2021. The contents of the above applications are all incorporated by reference as if fully set forth herein in their entirety.

FIELD AND BACKGROUND OF THE INVENTION

The present disclosure relates to the field of organic electroluminescent material technologies, and in particular to an organic electroluminescent material and a method preparing the same.

Organic light-emitting diodes (OLEDs) have attracted many researchers due to the advantages of high luminous efficiency, wide viewing angles, fast response time, wide temperature adaptation ranges, low energy consumption, lightness, thinness, and great application prospects, etc.

Material mainly used in organic light-emitting devices includes electrode material, carrier transport material, luminescent material, and so on, in which properties of pure organic thermally activated delayed fluorescence (TADF) material in the OLEDs have an important effect on luminescence performance of the OLEDs. In order to improve performance of the luminescent materials, phosphorescent heavy-metal complex material is usually used in the preparation of the luminescent material in the prior art. The commonly used heavy metals are precious metals such, as Ir and Pt. For one thing, costs of these materials are relatively high. Furthermore, a breakthrough is still required for the phosphorescent heavy-metal complex material in the aspect of blue light material, which is not conducive to further improvement on the luminescence performance of display panels. As far as the current OLED devices are concerned, the performance of the luminescent materials of the OLED is far from reaching actual requirements. Therefore, it is particularly important to develop organic functional materials with high performance.

Therefore, it is necessary to propose solutions to the problems in the prior art.

SUMMARY OF THE INVENTION

Technical Problems

Manufacturing costs of luminescent material of existing organic electroluminescent devices are relatively high, and existing luminescence performance is not conducive to improvement of overall performance of display panels.

Technical Solutions

In order to solve the above problems, the embodiments of the present disclosure provide an organic electroluminescent material to improve the problem of unsatisfactory light-emitting effects of the organic electroluminescent devices, thereby achieving the purposes of improving luminous efficiency of the organic electroluminescent devices and improving overall performances of the organic electroluminescent devices.

In order to solve the above technical problems, technical methods provided by embodiments of the present disclosure are as follows:

According to a first aspect of the embodiments of the present disclosure, a method of preparing organic electroluminescent material is provided, which includes the following steps:

a step S100 of mixing diboranthracene fluoride and a reaction reagent to obtain a mixed solution, and adding a catalyst to the mixed solution;

a step S101 of adding toluene and NaOt-Bu to the mixed solution to completely react the mixed solution, so as to obtain a reaction product; and a step S102 of cooling the reaction product to room temperature, pouring the reaction product into ice water, and extracting the reaction product with an extractant, so as to obtain the organic electroluminescent material.

According to an embodiment of the present disclosure, in the step S100, the diboranthracene fluoride is

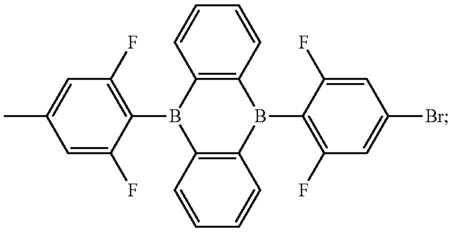 [SMILES: Cc1cc(F)c(B2c3ccccc3B(c3c(F)cc(Br)cc3F)c3ccccc32)c(F)c1]

and the reaction reagent is one of diphenylamine, carbazole, and 9,9-dimethyl-9,10-dihydroacridine.

According to an embodiment of the present disclosure, a molar ratio of the diboranthracene fluoride to the reaction reagent ranges from 1:1 to 1:3.

According to an embodiment of the present disclosure, the catalyst is a mixture of palladium acetate and tri-tert-butylphosphine tetrafluoroborate.

According to an embodiment of the present disclosure, a molar ratio of the diboranthracene fluoride to the palladium acetate to the tri-tert-butylphosphine tetrafluoroborate ranges from 1:0.04:0.12 to 1:0.12:0.36.

According to an embodiment of the present disclosure, the step S101 and the step S102 further comprise:

a step 200 of adding toluene to the mixed solution under protection of argon;

a step 201 of reacting the mixed solution with toluene for 12 to 48 hours under a temperature condition of 100° C. to 160° C., so as to obtain the reaction product; and a step 202 of extracting the reaction product in the extractant for multiple times to obtain extraction product, performing chromatography on the extraction product, isolating and purifying the extraction product, and extracting and purifying the extraction product.

In a second aspect of the embodiments of the present disclosure, an organic electroluminescent material is provided, including diboranthracene fluoride, and a structural formula of the diboranthracene fluoride is as follows:

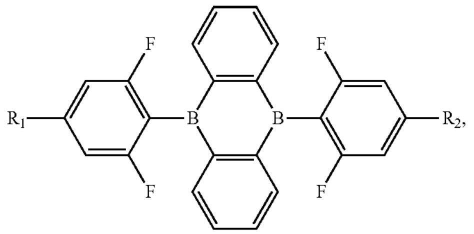

wherein $R_1$ and $R_2$ are different groups, the $R_1$ group is a heterocyclic compound, and the $R_2$ group is an electron withdrawing group.

According to an embodiment of the present disclosure, the $R_1$ group is one of following structural formulas:

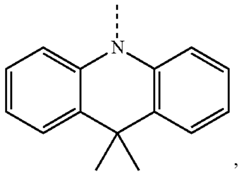,
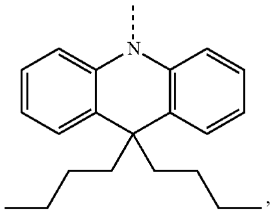,
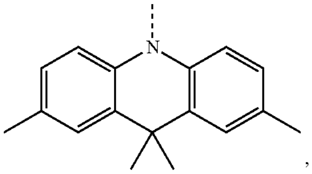,
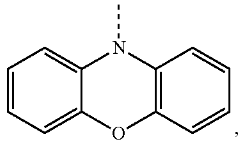,
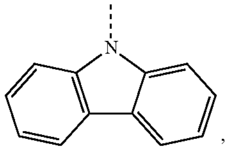,
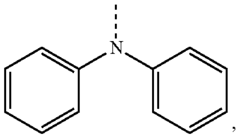,
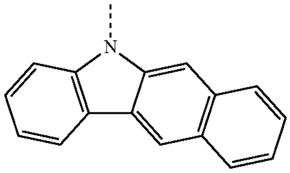,
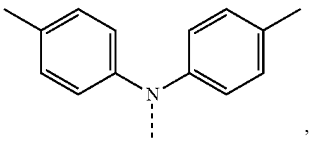,
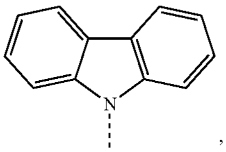,
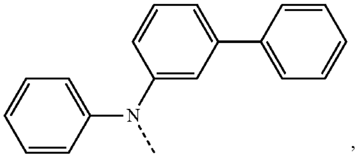,
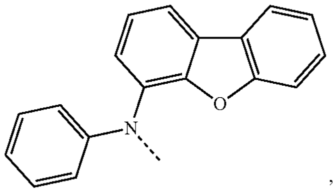, -continued

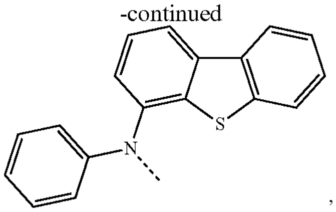,
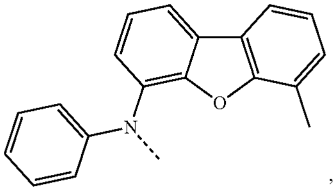,
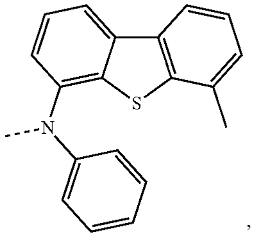,
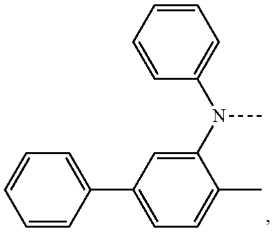,
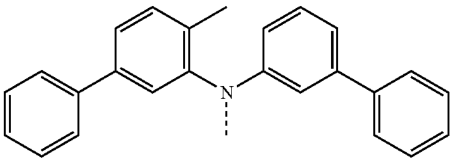,
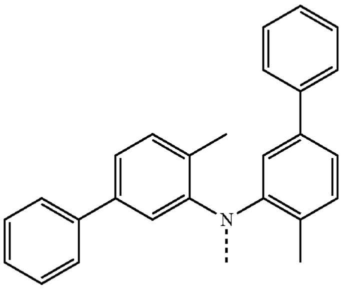, and
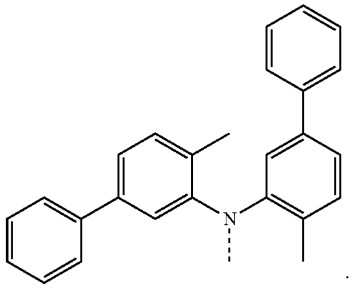.

According to an embodiment of the present disclosure, the $R_2$ group is one of following chemical structural formulas:

H, $CH_3$, F, CN,

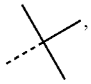, 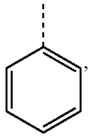, 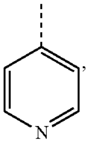, and 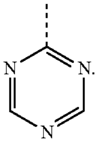.

According to the third aspect of the embodiments of the present disclosure, a method of preparing organic electroluminescent material is further provided, including the following steps:

a step S100 of mixing diboranthracene fluoride and a reaction reagent to obtain a mixed solution, and adding a catalyst to the mixed solution;

a step S101 of adding toluene to the mixed solution to completely react the mixed solution, so as to obtain a reaction product; and a step S102 of cooling the reaction product to room temperature, pouring the reaction product into ice water, and extracting the reaction product with an extractant, so as to obtain the organic electroluminescent material.

According to an embodiment of the present disclosure, in the step S100, the diboranthracene fluoride is:

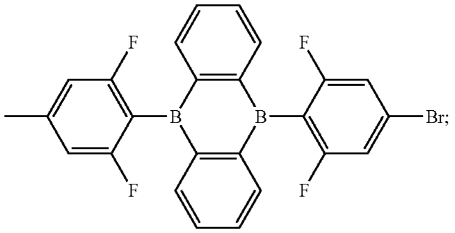 [SMILES: Cc1cc(F)c(B2c3ccccc3B(c3c(F)cc(Br)cc3F)c3ccccc32)c(F)c1]

and the reaction reagent is one of diphenylamine, carbazole, and 9,9-dimethyl-9,10-dihydroacridine.

According to an embodiment of the present disclosure, a molar ratio of the diboranthracene fluoride to the reaction reagent ranges from 1:1 to 1:3.

According to an embodiment of the present disclosure, the catalyst is a mixture of palladium acetate and tri-tert-butylphosphine tetrafluoroborate.

According to an embodiment of the present disclosure, a molar ratio of the diboranthracene fluoride to the palladium acetate to the tri-tert-butylphosphine tetrafluoroborate ranges from 1:0.04:0.12 to 1:0.12:0.36.

According to an embodiment of the present disclosure, in the step S101, the toluene is the toluene obtained by removing water and oxygen.

According to an embodiment of the present disclosure, the step S101 and the step S102 further comprise:

a step 200 of adding toluene to the mixed solution under protection of argon;

a step 201 of reacting the mixed solution with toluene for 12 to 48 hours under a temperature condition of 100° C. to 160° C., so as to obtain the reaction product; and a step 202 of extracting the reaction product in the extractant for multiple times to obtain extraction product, performing chromatography on the extraction product, isolating and purifying the extraction product, and extracting and purifying the extraction product.

According to an embodiment of the present disclosure, when chromatography is performed on the extraction product, the extractant is dichloromethane solution, and n-hexane is added to the dichloromethane solution.

According to an embodiment of the present disclosure, a volume ratio of the dichloromethane solution to the n-hexane is 1:1.

According to an embodiment of the present disclosure, a chemical structural formula of the prepared diboranthracene fluoride is as follows:

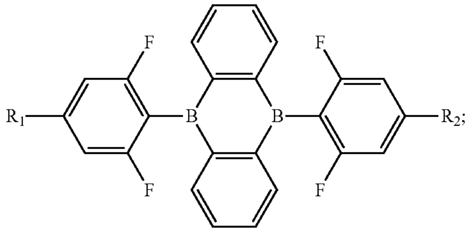

wherein $R_1$ and $R_2$ are different groups, the $R_1$ group is a heterocyclic compound, and the $R_2$ group is an electron withdrawing group.

Beneficial Effect

According to an embodiment of the present disclosure, the $R_2$ group is one of following chemical structural formulas:

H, $CH_3$, F, CN,

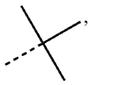, 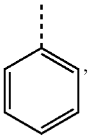, 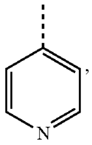, and 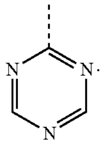.

Beneficial Effect

In summary, the beneficial effects of the embodiments of the present disclosure are as follows:

The embodiments of the present disclosure provide an organic electroluminescent material and a method preparing the same. In the present disclosure, a type of diboranthracene fluoride of organic electroluminescent material and a method preparing the same are provided. The diboranthracene fluoride has different groups, and the diboranthracene fluoride of organic electroluminescent material has a low single-triplet energy gap, high luminous efficiency, and high reverse intersystem crossing constant. Moreover, the preparation method and synthesis pathway provided by the embodiments of the present disclosure are simple, and the obtained product is stable, thereby effectively reducing preparation costs of the organic electroluminescent material in display panels, and improving the luminescence performance of the luminescent material of the panels.

DESCRIPTION OF SPECIFIC EMBODIMENTS OF THE INVENTION

Figure 1:
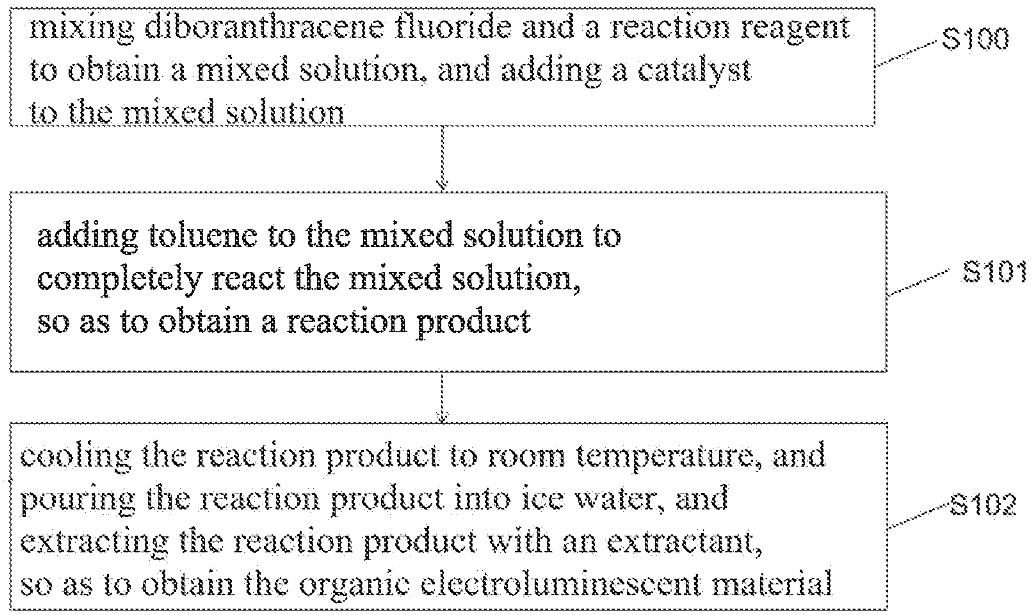
FIG. 1 is a flow chart of the preparation process provided by an embodiment of the present disclosure.

The description of the following embodiments refers to the attached drawings to illustrate specific embodiments that can be implemented in the present disclosure.

Luminescence performance of luminescent materials in display panels has an important effect on display effect of display panels. Therefore, in the manufacturing process of the display panels, improving the luminescence performance of the luminescent material has a positive effect on improving the display effect of the display panels.

Most of the luminescent materials prepared in the prior art use phosphorescent heavy-metal complex material and pure organic activated delayed fluorescent material. Precious metal material is usually used in the phosphorescent heavy-metal complex material, which has a high cost. For the pure organic activated delayed fluorescent material, there are still certain technological difficulties in preparing the pure organic activated delayed fluorescent material with fast reverse intersystem crossing constant and high photoluminescence quantum yield during preparation. Therefore, further improvement on the luminescence performance of the display panels is limited by the existing luminescent materials to a certain extent.

The embodiments of the present disclosure provide a luminescent material of a display panel and a method preparing the same, so as to effectively improve a luminous effect of the display panel, effectively reduce the production processes and the production costs of the display panel, and improve performance of organic electroluminescent devices.

Specifically, an organic electroluminescent material provided in the embodiments of the present disclosure includes diboranthracene fluoride. The diboranthracene fluoride provided in the embodiments of the present disclosure is finally formed through a series of chemical reactions between various substances. The preparation process is simple, and the formed diboranthracene fluoride has better luminescence performance.

The diboranthracene fluoride provided in the embodiments of the present disclosure is a compound finally formed through various chemical reactions on the basis of the structure of triphenylborane. The diboranthracene fluoride has a chemical structural formula (II) of the following:

formula (I)

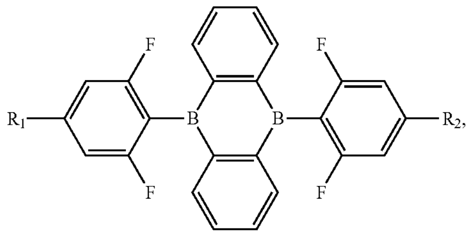

wherein $R_1$ and $R_2$ are different groups, the $R_1$ group is a heterocyclic compound and derivatives thereof, and the $R_2$ group is an electron withdrawing group and derivatives thereof.

Specifically, the $R_1$ group provided in the embodiments of the present disclosure is one of the chemical structural formulas provided in the following formulas (II):

formula (II)

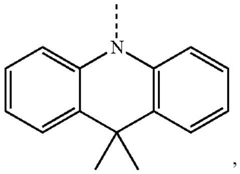
,
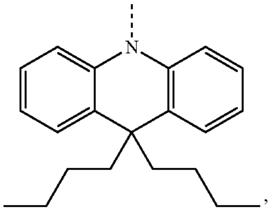
,
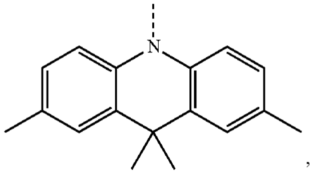
,
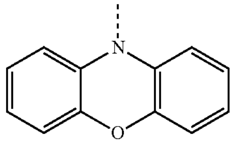
,
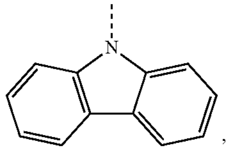
,
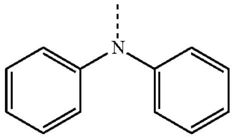
,
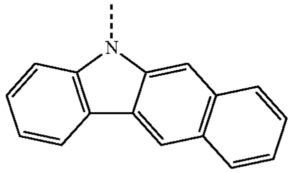
,
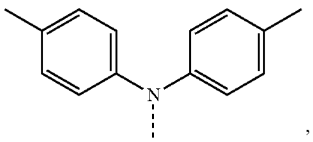
,
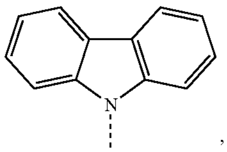
,
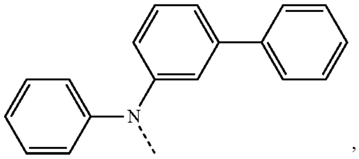
,
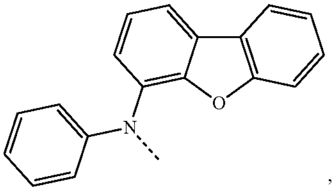
,
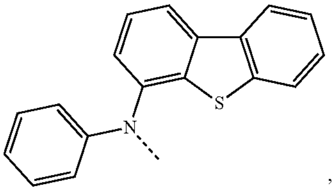
,
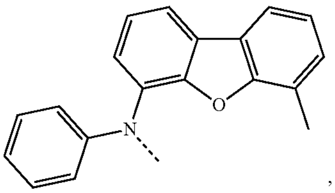
, -continued

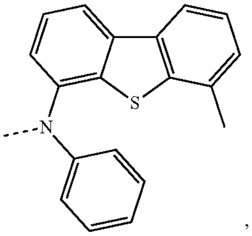

,

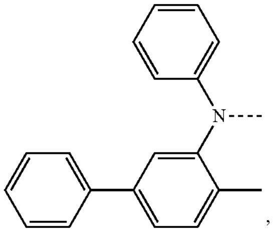

,

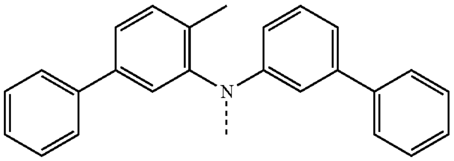

,

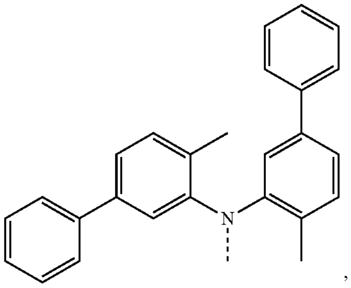

, and

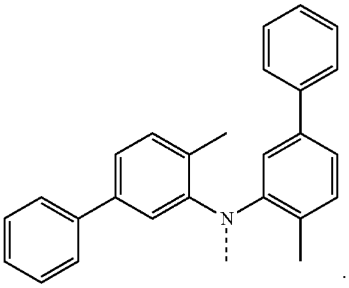

.

Moreover, the $R_2$ group provided in the embodiments of the present disclosure is one of the chemical structural formulas provided in the following formulas (III):

H, $CH_3$, F, CN,

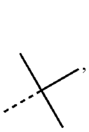

,

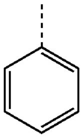

,

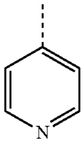

, and

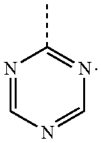

.

formula (III)

In order to further illustrate the diboranthracene fluorides provided in the embodiments of the present disclosure, the three chemical structural formulas in the above chemical structural formulas are taken as examples. Other products also have excellent comprehensive properties, and will not be described in detail here. Refer to FIG. 1. FIG. 1 is a flow chart of the preparation process provided in the embodiment of the present disclosure. Target products in the embodiments of the disclosure are prepared and formed by the following steps:

a step S100 of mixing diboranthracene fluoride and a reaction reagent to obtain a mixed solution, and adding a catalyst to the mixed solution;

a step S101 of adding toluene to the mixed solution to completely react the mixed solution, so as to obtain a reaction product; and a step S102 of cooling the reaction product to room temperature, pouring the reaction product into ice water, and extracting the reaction product with an extractant, so as to obtain the organic electroluminescent material.

Specifically, the diboranthracene fluoride provided in the embodiments of the present disclosure is specifically illustrated by taking compound A, compound B, and compound C as examples. Moreover, compound D is used as raw material to synthesize compound A, compound B, and compound C in the present disclosure.

The chemical structural formula of compound A is as follows:

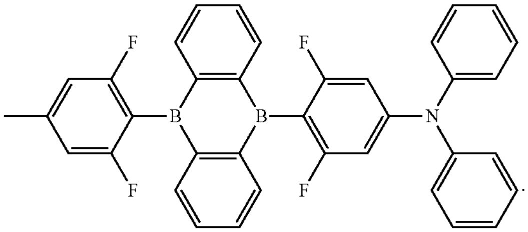 [SMILES: Cc1cc(F)c(B2c3ccccc3B(c3c(F)cc(N(c4ccccc4)c4ccccc4)cc3F)c3ccccc32)c(F)c1]

.

The chemical structural formula of compound B is as follows:

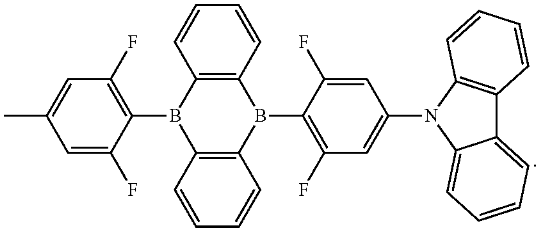 [SMILES: Cc1cc(F)c(B2c3ccccc3B(c3c(F)cc(-n4c5ccccc5c5ccccc54)cc3F)c3ccccc32)c(F)c1]

.

The chemical structural formula of compound C is as follows:

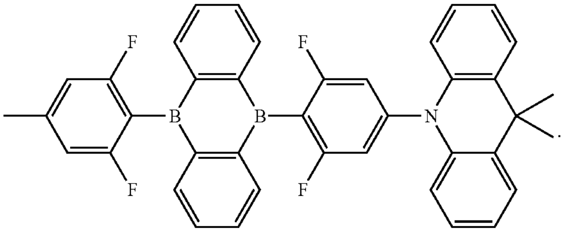

.

The chemical structural formula of compound D is as follows:

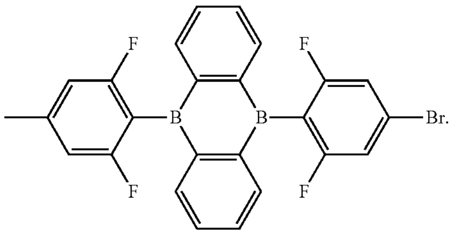 [SMILES: Cc1cc(F)c(B2c3ccccc3B(c3c(F)cc(Br)cc3F)c3ccccc32)c(F)c1]

Specifically, in the case that the diboroanthracene fluoride provided in the embodiment of the present disclosure is compound A, the present disclosure provides a method of preparing compound A.

Compound A is prepared according to the following steps.

A reagent bottle which can be a 150 ml two-necked flask is used, and raw material of the compound D is added into the two-necked flask. In addition, a reagent and a reaction catalyst are added into the reagent bottle.

Specifically, for synthesizing compound A, the reaction reagent is selected as diphenylamine, and the reaction catalyst is selected as palladium acetate ($Pd(OAc)_2$) and tri-tert-butylphosphine tetrafluoroborate ($(t\text{-}Bu)_3HPBF_4$).

After the above-mentioned various materials are completely added, the two-necked flask is transferred to a glove box, and another catalyst is added into the two-necked flask in the glove box, wherein the catalyst may be NaOt-Bu. Then, under the atmosphere of a protective gas, dewatered and deoxygenated toluene is added into the two-necked flask, wherein the protective gas can be selected as inert gas, such as argon.

In the embodiments of the present disclosure, in each of the above steps, specific proportions of the added materials are as follows.

A molar ratio between the compound D and the diphenylamine ranges from 1:1 to 1:3, preferably 1:1.2 in the embodiment of the present disclosure.

A molar ratio of the compound D to the palladium acetate to the tri-tert-butylphosphine tetrafluoroborate ranges from 1:0.04:0.12 to 1:0.12:0.36, preferably 1:0.08:0.24 in the embodiment of the present disclosure.

A molar ratio of the compound D to the NaOt-Bu ranges from 1:1 to 1:3, preferably 1:2.4 in the embodiment of the present disclosure.

A ratio between the compound D and the toluene is that 8-20 ml of toluene, preferably 12 ml in the embodiment of the present disclosure, needs to be added for every 1 mol of the compound D.

Specifically, in accordance with the ratio relationships of the above-mentioned materials, the following specific contents are used as an example for testing in the embodiment of the present disclosure.

The compound D is 2.46 g, 5 mmol, the diphenylamine is 1.01 g, 6 mmol, the palladium acetate is 90 mg, 0.4 mmol, the tri-tert-butylphosphine tetrafluoroborate is 0.34 g, 1.2 mmol, the NaOt-Bu is 1.16 g, 12 mmol, and the toluene is 60 ml.

The substances in the above two-neck flask are reacted in a vacuum protective box, and the glove box is taken as an example in the embodiment of the present disclosure. During the reaction, reaction conditions in the glove box are controlled. A temperature of the glove box is controlled at 100° C. to 160° while reaction time is controlled at 12 hours to 48 hours, preferably 120° C. and 24 hours. The specific reaction temperature and the reaction time are adjusted according to actual situations of the reaction.

After the above-mentioned substances are fully reacted, the two-necked flask is taken out, and the reactants and the reaction products obtained by the reaction are cooled to room temperature.

After completely cooled to room temperature, the reaction product obtained by the reaction is extracted. Specifically, when the reaction product is extracted, the reactant in the two-necked flask is first poured into 300 ml of ice water. In addition, an extractant is added to the ice water. The extractant may be dichloromethane. The reaction product is extracted with dichloromethane for multiple times, such as two to three times, so that the reaction product can be completely dissolved in the dichloromethane solution. After the extraction is complete, the extract is spun into a silica gel-like organic solution. Moreover, column chromatography is performed on the organic solution. When the column chromatography is preformed, n-hexane is added into the dichloromethane solution, wherein a volume ratio of the dichloromethane to the n-hexane is 1:1. Thus, the resulting reaction product is isolated from the extraction solution mentioned above.

After the extraction is complete, the final reaction product obtained is compound A. In the embodiment of the present disclosure, the compound A is 1.9 g, and a yield of the reaction product is 65% during the entire reaction process.

Mass spectrometry (MS(EI)) is performed on the compound A, and m/z is 581.10. It can be known through the mass spectrometry analyzing the structure that the compound A matches the above chemical structural formula. That is, the reaction product is compound A.

Specifically, the above reaction proceeds according to the following reaction relationship:

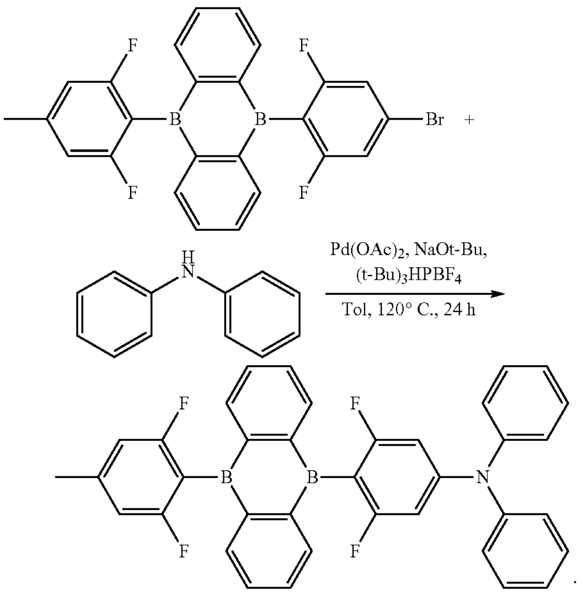

Further, in the case that the diboranthracene fluoride provided in the embodiment of the present disclosure is compound B, the present disclosure provides a method of preparing the compound B.

Compound B is prepared according to the following steps.

A reagent bottle which can be a 150 ml two-necked flask is used, and raw material of the compound D is added into the two-necked flask. In addition, a reagent and a reaction catalyst are added into the reagent bottle.

Specifically, for synthesizing compound B, the reaction reagent is selected as carbazole, and the reaction catalyst is selected as palladium acetate ($Pd(OAc)_2$) and tri-tert-butylphosphine tetrafluoroborate ($(t\text{-}Bu)_3HPBF_4$).

After the above-mentioned various materials are completely added, the two-necked flask is transferred to a glove box, and another catalyst is added into the two-necked flask in the glove box, wherein the catalyst may be NaOt-Bu. Then, under the atmosphere of a protective gas, dewatered and deoxygenated toluene is added into the two-necked flask, wherein the protective gas can be selected as inert gas, such as argon.

In the embodiments of the present disclosure, in each of the above steps, specific proportions of the added materials are as follows.

A molar ratio between the compound D and the carbazole ranges from 1:1 to 1:3, preferably 1:1.2 in the embodiment of the present disclosure.

A molar ratio of the compound D to the palladium acetate to the tri-tert-butylphosphine tetrafluoroborate ranges from 1:0.04:0.12 to 1:0.12:0.36, preferably 1:0.08:0.24 in the embodiment of the present disclosure.

A molar ratio of the compound D to the NaOt-Bu ranges from 1:1 to 1:3, preferably 1:2.4 in the embodiment of the present disclosure.

A ratio between the compound D and the toluene is that 8-20 ml of toluene, preferably 12 ml in the embodiment of the present disclosure, needs to be added for every 1 mol of the compound D.

Specifically, in accordance with the ratio relationships of the above-mentioned materials, the following specific contents are used as an example for testing in the embodiment of the present disclosure.

The compound D is 2.46 g, 5 mmol, the carbazole is 1.01 g, 6 mmol, the palladium acetate is 90 mg, 0.4 mmol, the tri-tert-butylphosphine tetrafluoroborate is 0.34 g, 1.2 mmol, the NaOt-Bu is 1.16 g, 12 mmol, and the toluene is 60 ml.

The substances in the above two-neck flask are reacted in a vacuum protective box, and the glove box is taken as an example in the embodiment of the present disclosure. During the reaction, reaction conditions in the glove box are controlled. A temperature of the glove box is controlled at 100° C. to 160° while reaction time is controlled at 12 hours to 48 hours, preferably 120° C. and 24 hours or 135° C. and 16 hours. The specific reaction temperature and the reaction time are adjusted according to actual situations of the reaction.

After the above-mentioned substances are fully reacted, the two-necked flask is taken out, and the reactants and the reaction products obtained by the reaction are cooled to room temperature.

After completely cooled to room temperature, the reaction product obtained by the reaction is extracted. Specifically, when the reaction product is extracted, the reactant in the two-necked flask is first poured into 300 ml of ice water. In addition, an extractant is added to the ice water. The extractant may be dichloromethane. The reaction product is extracted with dichloromethane for multiple times, such as two to three times, so that the reaction product can be completely dissolved in the dichloromethane solution. After the extraction is complete, the extract is spun into a silica gel-like organic solution. Moreover, column chromatography is performed on the organic solution. When the column chromatography is preformed, n-hexane is added into the dichloromethane solution, wherein a volume ratio of the dichloromethane to the n-hexane is 1:1. Thus, the resulting reaction product is isolated from the extraction solution mentioned above.

After the extraction is complete, the final reaction product obtained is compound B. In the embodiment of the present disclosure, the compound B is 2.0 g, and a yield of the reaction product is 69% during the entire reaction process.

Mass spectrometry (MS(EI)) is performed on the compound B, and m/z is 579.20. It can be known through the mass spectrometry analyzing the structure that the compound B matches the above chemical structural formula. That is, the reaction product is compound B.

Specifically, the above reaction proceeds according to the following reaction relationship:

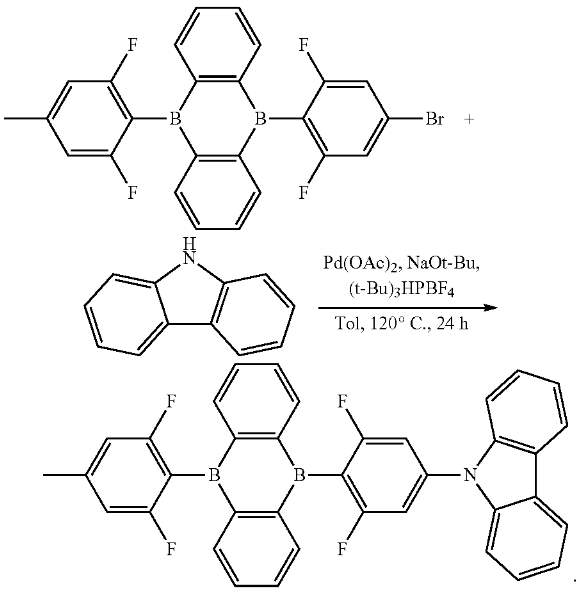

Further, in the case that the diboranthracene fluoride provided in the embodiment of the present disclosure is compound C, the present disclosure provides a method of preparing the compound C.

Compound C is prepared according to the following steps.

A reagent bottle which can be a 150 ml two-necked flask is used, and raw material of the compound D is added into the two-necked flask. In addition, a reagent and a reaction catalyst are added into the reagent bottle.

Specifically, for synthesizing compound C, the reaction reagent is selected as 9,9-dimethyl-9,10-dihydroacridine, and the reaction catalyst is selected as palladium acetate ($Pd(OAc)_2$) and tri-tert-butylphosphine tetrafluoroborate ($(t\text{-}Bu)_3HPBF_4$).

After the above-mentioned various materials are completely added, the two-necked flask is transferred to a glove box, and another catalyst is added into the two-necked flask in the glove box, wherein the catalyst may be NaOt-Bu. Then, under the atmosphere of a protective gas, dewatered and deoxygenated toluene is added into the two-necked flask, wherein the protective gas can be selected as inert gas, such as argon.

In the embodiments of the present disclosure, in each of the above steps, specific proportions of the added materials are as follows.

A molar ratio between the compound D and the 9,9-dimethyl-9,10-dihydroacridine ranges from 1:1 to 1:3, preferably 1:1.2 in the embodiment of the present disclosure.

A molar ratio of the compound D to the palladium acetate to the tri-tert-butylphosphine tetrafluoroborate ranges from 1:0.04:0.12 to 1:0.12:0.36, preferably 1:0.08:0.24 in the embodiment of the present disclosure.

A molar ratio of the compound D to the NaOt-Bu ranges from 1:1 to 1:3, preferably 1:2.4 in the embodiment of the present disclosure.

A ratio between the compound D and the toluene is that 8-20 ml of toluene, preferably 12 ml in the embodiment of the present disclosure, needs to be added for every 1 mol of the compound D.

Specifically, in accordance with the ratio relationships of the above-mentioned materials, the following specific contents are used as an example for testing in the embodiment of the present disclosure.

The compound D is 2.46 g, 5 mmol, the 9,9-dimethyl-9,10-dihydroacridine is 1.01 g, 6 mmol, the palladium acetate is 90 mg, 0.4 mmol, the tri-tert-butylphosphine tetrafluoroborate is 0.34 g, 1.2 mmol, the NaOt-Bu is 1.16 g, 12 mmol, and the toluene is 60 ml.

The substances in the above two-neck flask are reacted in a vacuum protective box, and the glove box is taken as an example in the embodiment of the present disclosure. During the reaction, reaction conditions in the glove box are controlled. A temperature of the glove box is controlled at 100° C. to 160° while reaction time is controlled at 12 hours to 48 hours, preferably 120° C. and 24 hours or 160° C. and 12 hours. The specific reaction temperature and the reaction time are adjusted according to actual situations of the reaction.

After the above-mentioned substances are fully reacted, the two-necked flask is taken out, and the reactants and the reaction products obtained by the reaction are cooled to room temperature.

After completely cooled to room temperature, the reaction product obtained by the reaction is extracted. Specifically, when the reaction product is extracted, the reactant in the two-necked flask is first poured into 300 ml of ice water. In addition, an extractant is added to the ice water. The extractant may be dichloromethane. The reaction product is extracted with dichloromethane for multiple times, such as two to three times, so that the reaction product can be completely dissolved in the dichloromethane solution. After the extraction is complete, the extract is spun into a silica gel-like organic solution. Moreover, column chromatography is performed on the organic solution. When the column chromatography is preformed, n-hexane is added into the dichloromethane solution, wherein a volume ratio of the dichloromethane to the n-hexane is 1:1. Thus, the resulting reaction product is isolated from the extraction solution mentioned above.

After the extraction is complete, the final reaction product obtained is compound C. In the embodiment of the present disclosure, the compound C is 2.1 g, and a yield of the reaction product is 68% during the entire reaction process.

Mass spectrometry (MS(EI)) is performed on the compound C, and m/z is 621.10. It can be known through the mass spectrometry analyzing the structure that the compound C matches the above chemical structural formula. That is, the reaction product is compound C.

Specifically, the above reaction proceeds according to the following reaction relationship:

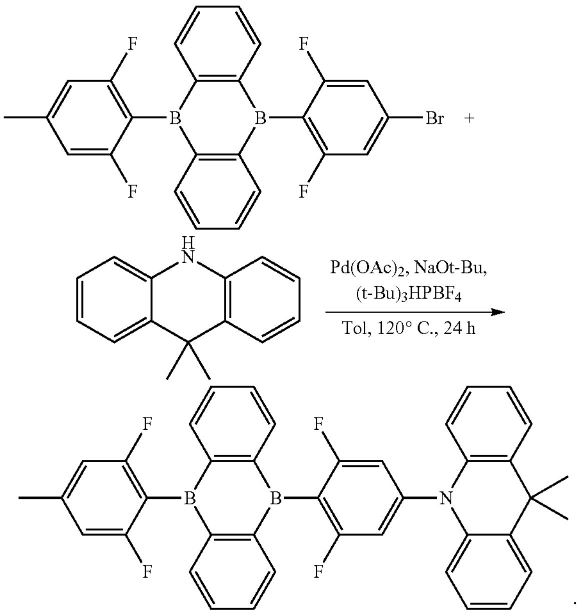

The organic electroluminescent material prepared in the embodiments of the present disclosure has a low single-triplet energy gap, high luminous efficiency, and high reverse intersystem crossing constant. Moreover, the preparation method and synthesis pathway provided by the embodiments of the present disclosure are simple, and the obtained product is stable, thereby effectively reducing preparation costs of the organic electroluminescent material in display panels, and improving the luminescence performance of the luminescent material of the panels.

The luminescent materials, i.e., the compound A, the compound B, and the compound C, are respectively obtained by the preparation methods provided in the embodiments of the present disclosure. The lowest singlet energy level, lowest triplet energy level, electrochemical energy level, and peak width of the above-mentioned luminescent materials obtained in the present disclosure are measured, as shown in Table 1.

TABLE 1

Various parameter values:

| | PL Peak (nm) | $S_1$ (eV) | $T_1$ (eV) | $\Delta E_{ST}$ (eV) | full width at half maxima (nm) |
|---|---|---|---|---|---|
| DMAC-DPS | 470 | 2.64 | 2.55 | 0.09 | 96 |
| compound A | 459 | 2.70 | 2.60 | 0.10 | 24 |
| compound B | 464 | 2.67 | 2.61 | 0.06 | 24 |
| compound C | 467 | 2.66 | 2.58 | 0.08 | 38 |

It can be seen from the above table that the emission peaks of the target compounds of the compound A, the compound B, and the compound C are all higher than those of the sky blue TADF material, i.e., bis[4-(9,9-dimethyl-9,10-dihydroacridine)phenyl]sulfone (DMAC-DPS), commonly used in existing display panels, in which the emission peak of the DMAC-DPS is 470 nm. Among the compound A, the compound B, and the compound C provided in the examples of the present disclosure, the compound A has the bluest emission effect, with an emission peak of 459 nm, indicating that these compounds can be used as blue light guests in OLED devices. Moreover, values of $\Delta E_{ST}$ corresponding to the compound A, the compound B, and the compound C are all less than 0.2 eV, indicating that they all have a strong pure organic thermally activated delayed fluorescence effect. In addition, the full width at half maximum of the luminescent materials obtained in the examples of the present disclosure is much smaller than that of the DMAC-DPS.

Therefore, in the present disclosure, on the basis of rigid structure of triphenylborane, the overall strength of charge transfer is adjusted through different electron donating units, and thus a series of the blue light thermally activated delayed fluorescence materials are synthesized with low single-triplet energy gaps, high luminous efficiency, and high reverse intersystem crossing constants, while narrow spectral emission of the rigid structure is realized. Their structures were confirmed by mass spectrometry, and then their photophysical properties were studied in detail. Finally, these blue TADF materials are applied to light-emitting layers to manufacture a series of OLEDs with high performance. The luminescent materials provided in the examples of the present disclosure also possess the improved luminescence performance.

Figure 2:
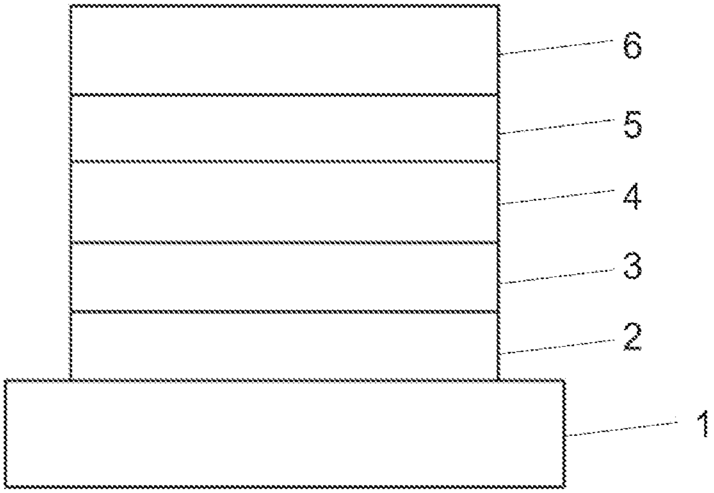
FIG. 2 is a schematic diagram of the structure of the film layers of the organic electroluminescent device provided by an embodiment of the present disclosure.

As shown in FIG. 2, which is a schematic diagram of structure of film layers of an organic electroluminescent device provided by an embodiment of the present disclosure, material of the light-emitting layer of the organic electroluminescent device adopts the thermally activated delayed fluorescence material prepared in the present application. Specifically, the organic electroluminescent device includes the following film layers:

A substrate layer 1: the substrate layer 1 may be a conductive glass substrate layer. Specifically, the substrate layer 1 may be indium tin oxide (ITO), and the indium tin oxide film layer may be an anode layer.

A hole injection layer 2: material of the hole injection layer 2 may be 1,4,5,8,9,11-hexaazabenzonitrile (HATCN), used to inject holes from a cathode into the OLED device.

A transport layer 3: material of the transport layer 3 may be selected as 4,4',4"-tris(carbazol-9-yl)triphenylamine (TCTA), used to inject the hole injection layer into holes in the OLED to transport to the light-emitting layer.

A light-emitting layer 4: material of the light-emitting layer 4 may be selected as bis[2-((oxo)diphenylphosphino) phenyl]ether (DPEPO): DMAC-DPS, or a blue light material with delayed fluorescence in the present disclosure. Holes and electrons recombine in the light-emitting layer, and transfer energy to luminescent material, so that the luminescent material is excited to an excited state, and the luminescent material spontaneously returns to the ground state from the excited state, so as to emit blue light through radiation transition.

An electron transport layer 5: material of the electron transport layer 5 can be selected as 1,3,5-tris(3-(3-pyridyl) phenyl)benzene($Tm_3PyPB$), used to inject the electron injection layer into electrons in the OLED to transport to the light-emitting layer.

A cathode layer 6: material of the cathode layer 6 can be selected as lithium fluoride/aluminum, used to inject electrons and serving as a total reflection cathode.

Specifically, the chemical structural formulas corresponding to the above-mentioned materials HATCN, TCTA, DPEPO, DMAC-DPS, and $Tm_3PyPB$ provided in the examples of the present disclosure are as follows:

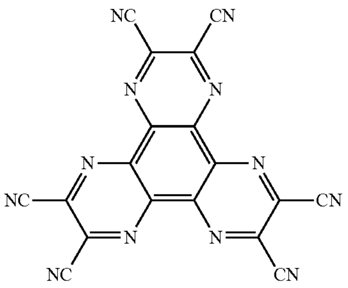

HATCN

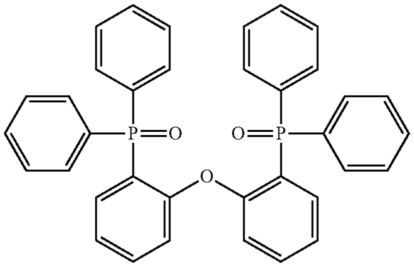

DPEPO

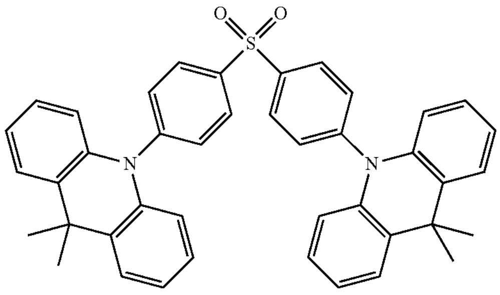

DMAC-DPS

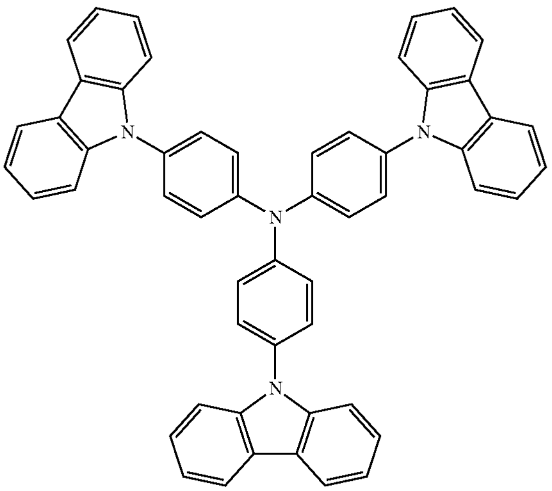

TCTA

-continued

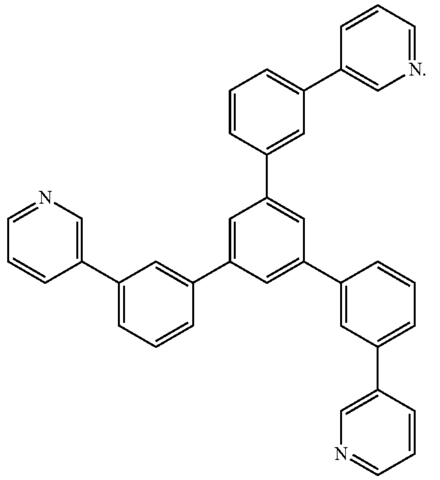

Tm3PyPB

Further, in the present disclosure, performance of the prepared organic electroluminescent devices using different parameters is verified. In the manufacture and formation of the organic electroluminescent devices, HATCN, TCTA, DPEPO and thermally activated delayed fluorescence material, $Tm_3PyPB$, 1 nm LiF, and 100 nm Al are sequentially evaporated on a cleaned conductive glass (ITO) substrate under a high vacuum condition. The substrate layer 1, the hole injection layer 2, the transport layer 3, the light-emitting layer 4, the electron transport layer 5, and the cathode layer 6 are finally formed corresponding to the above-mentioned materials.

The difference between different organic electroluminescent devices lies in the difference in luminescent materials. Specifically, the performance of the organic electroluminescent devices using luminescent materials of DMAC-DPS, compound A, compound B, and compound C is verified.

Specifically, taking the device 1, the device 2, the device 3, and the device 4 as examples, the film material and the film thickness corresponding to each device are shown as follows.

Device 1:

ITO/HATCN (5 nm)/TCTA (35 nm)/DPEPO: DMAC-DPS (10%, 20 nm)/$Tm_3PyPB$ (40 nm)/LiF (1 nm)/AI (100 nm);

Device 2:

ITO/HATCN (5 nm)/TCTA (35 nm)/DPEPO: compound A (10%, nm)/$Tm_3PyPB$ (40 nm)/LiF (1 nm)/AI (100 nm)

Device 3:

ITO/HATCN (5 nm)/TCTA (35 nm)/DPEPO: compound B (10%, 20 nm)/$Tm_3PyPB$ (40 nm)/LiF (1 nm)/AI (100 nm)

Device 4:

ITO/HATCN (5 nm)/TCTA (35 nm)/DPEPO: compound C (10%, 20 nm)/$Tm_3PyPB$ (40 nm)/LiF (1 nm)/AI (100 nm)

The performance of the above-mentioned different devices is measured, as shown in Table 2. Table 2 shows the corresponding parameter values of the different devices.

TABLE 2 parameter values of different devices:

| Devices | material of light-emitting layer, | maximum current efficiency (%) | EL peak (nm) | maximum external quantum efficiency (%) |
|---|---|---|---|---|
| Device 1 | DMAC-DPS | 25.6 | 470 | 19.1% |
| Device 2 | compound A | 30.1 | 459 | 26.5% |
| Device 3 | compound B | 29.6 | 464 | 23.1% |
| Device 4 | compound C | 28.1 | 467 | 21.8% |

In the above test results, the device 1 is a device as a control group. Material of the light-emitting layer of the device 1 is formed of commonly used luminescent material in the prior art, and the light-emitting layers in the device 2, the device 3, and the device 4 are respectively prepared by using the luminescent materials provided in the embodiments of the present disclosure. As seen from the above table, the maximum current efficiency and maximum external quantum efficiency of the organic electroluminescent devices formed by the light-emitting layers prepared by compound A, compound B, and compound C provided in the present disclosure are higher than those of the device 1 formed by the commonly used luminescent material of DMAC-DPS. Accordingly, the light-emitting layers formed by the compounds provided in the present disclosure have better luminescence performance, resulting in better luminescence performance of the organic electroluminescent devices.

The organic electroluminescent material and the method preparing the same provided by the embodiments of the present disclosure are described in detail above. Specific examples are used herein to illustrate the principles and implementations of present disclosure. The description of the above embodiments is merely used to help understand the technical solutions and core ideas of present disclosure. It should be understood by those skilled in the art that modifications to the technical solutions described in the foregoing embodiments or equivalent replacements to part of the technical features can be made. However, these modifications or replacements do not make essence of the corresponding technical solutions to deviate from scope of the technical solutions of the embodiments of the present disclosure.

What is claimed is:

1. A method of preparing organic electroluminescent material, comprising:

a step S100 of mixing a diboranthracene fluoride

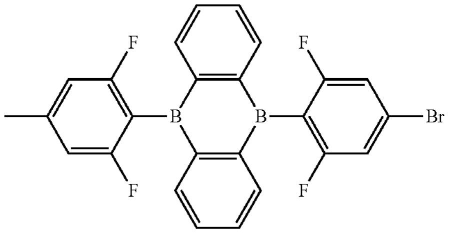 [SMILES: Cc1cc(F)c(B2c3ccccc3B(c3c(F)cc(Br)cc3F)c3ccccc32)c(F)c1]

and a reaction reagent to obtain a mixed solution, and adding a catalyst to the mixed solution;

a step S101 of adding toluene and NaOt-Bu to the mixed solution to completely react the mixed solution, so as to obtain a reaction product; and a step S102 of cooling the reaction product to room temperature, pouring the reaction product into ice water, and extracting the reaction product with an extractant, so as to obtain the organic electroluminescent material.

2. The method of claim 1, wherein in the step S100, the reaction reagent is one of diphenylamine, carbazole, and 9,9-dimethyl-9,10-dihydroacridine.

3. The method of claim 1, wherein a molar ratio of the diboranthracene fluoride to the reaction reagent ranges from 1:1 to 1:3.

4. The method of claim 1, wherein the catalyst is a mixture of palladium acetate and tri-tert-butylphosphine tetrafluoroborate.

5. The method of claim 4, wherein a molar ratio of the diboranthracene fluoride to the palladium acetate to the tri-tert-butylphosphine tetrafluoroborate ranges from 1:0.04:0.12 to 1:0.12:0.36.

6. The method of claim 1, wherein the step S101 and the step S102 further comprise:

a step 200 of adding toluene to the mixed solution under protection of argon;

a step 201 of reacting the mixed solution with toluene for 12 to 48 hours under a temperature condition of 100° C. to 160° C., so as to obtain the reaction product; and a step 202 of extracting the reaction product in the extractant for multiple times to obtain extraction product, performing chromatography on the extraction product, isolating and purifying the extraction product, and extracting and purifying the extraction product.

7. A method of preparing organic electroluminescent material, comprising:

a step S100 of mixing a diboranthracene fluoride

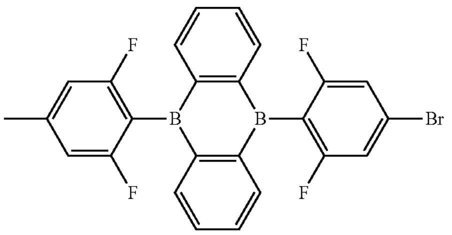 [SMILES: Cc1cc(F)c(B2c3ccccc3B(c3c(F)cc(Br)cc3F)c3ccccc32)c(F)c1]

and a reaction reagent to obtain a mixed solution, and adding a catalyst to the mixed solution;

a step S101 of adding toluene to the mixed solution to completely react the mixed solution, so as to obtain a reaction product; and a step S102 of cooling the reaction product to room temperature, pouring the reaction product into ice water, and extracting the reaction product with an extractant, so as to obtain the organic electroluminescent material.

8. The method of claim 7, wherein in the step S100, the reaction reagent is one of diphenylamine, carbazole, and 9,9-dimethyl-9,10-dihydroacridine.

9. The method of claim 7, wherein a molar ratio of the diboranthracene fluoride to the reaction reagent ranges from 1:1 to 1:3.

10. The method of claim 7, wherein the catalyst is a mixture of palladium acetate and tri-tert-butylphosphine tetrafluoroborate.

11. The method of claim 10, wherein a molar ratio of the diboranthracene fluoride to the palladium acetate to the tri-tert-butylphosphine tetrafluoroborate ranges from 1:0.04:0.12 to 1:0.12:0.36.

12. The method of claim 7, wherein in the step S101, the toluene is the toluene obtained by removing water and oxygen.

13. The method of claim 7, wherein the step S101 and the step S102 further comprise:

a step 200 of adding toluene to the mixed solution under protection of argon;

a step 201 of reacting the mixed solution with toluene for 12 to 48 hours under a temperature condition of 100° C. to 160° C., so as to obtain the reaction product; and a step 202 of extracting the reaction product in the extractant for multiple times to obtain extraction product, performing chromatography on the extraction product, isolating and purifying the extraction product, and extracting and purifying the extraction product.

14. The method of claim 13, wherein when chromatography is performed on the extraction product, the extractant is dichloromethane solution, and n-hexane is added to the dichloromethane solution.

15. The method of claim 14, wherein a volume ratio of the dichloromethane solution to the n-hexane is 1:1.

* * * * *